United States Patent
Ojima et al.

(10) Patent No.: US 10,305,412 B2
(45) Date of Patent: May 28, 2019

(54) SEMICONDUCTOR DEVICE (71) Applicant: Renesas Electronics Corporation, Tokyo (JP)

(72) Inventors: Yusuke Ojima, Tokyo (JP); Yoshihiko Yokoi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 276 days.

(21) Appl. No.: 15/431,808

(22) Filed: Feb. 14, 2017

(65) Prior Publication Data

US 2017/0288597 A1  Oct. 5, 2017

(30) Foreign Application Priority Data

Mar. 31, 2016  (JP) ................. 2016-070662

(51) Int. Cl.
*H02P 29/028* (2016.01)
*H02P 27/08* (2006.01)
*H03K 17/04* (2006.01)
*H03K 17/08* (2006.01)
*H03K 17/16* (2006.01)
*H03K 17/567* (2006.01)
*H03K 17/082* (2006.01)

(52) U.S. Cl.
CPC ............ *H02P 29/028* (2013.01); *H02P 27/08* (2013.01); *H03K 17/0406* (2013.01); *H03K 17/08* (2013.01); *H03K 17/163* (2013.01); *H03K 17/0828* (2013.01); *H03K 17/567* (2013.01); *H03K 2217/0027* (2013.01)

(58) Field of Classification Search
CPC ... H02P 29/028; H02P 27/08; H03K 17/0406; H03K 17/08
See application file for complete search history.

(56) References Cited

U.S. PATENT DOCUMENTS

| 7,741,894 | B2 * | 6/2010 | Kojima | ................ H03K 17/166 327/427 |
| 8,138,818 | B2 * | 3/2012 | Tsunoda | ............. H03K 17/0406 327/108 |
| 8,884,660 | B2 * | 11/2014 | Fukuta | ................... H03K 17/00 327/109 |
| 9,184,739 | B2 | 11/2015 | Kaneko et al. | |
| 9,735,767 | B2 * | 8/2017 | Watanabe | .............. H03K 17/08 |
| 9,748,942 | B2 * | 8/2017 | Akahane | ........... H03K 17/0828 |

(Continued)

FOREIGN PATENT DOCUMENTS

JP  4942861 B1  5/2012

*Primary Examiner* — Scott Bauer
(74) *Attorney, Agent, or Firm* — Mattingly & Malur, PC (57) ABSTRACT In a semiconductor device in the related art, it has been necessary to match the threshold voltage of a power element with the circuit operation of a gate driver; accordingly, it has been difficult to realize the operation of the gate driver most appropriate for the employed power element. According to one embodiment, when a power element is turned off, the semiconductor device monitors the collector voltage of the power element, and increases the number of NMOS transistors that draw out charges from the gate of the power element in a period until the collector voltage becomes lower than the pre-set determination threshold, rather than in the period after the collector voltage becomes lower than the determination threshold.

10 Claims, 9 Drawing Sheets

(56) References Cited

U.S. PATENT DOCUMENTS

2012/0075761 A1* 3/2012 Miura ............... H02M 1/32
    361/93.1
2016/0099665 A1* 4/2016 Chen ............... H02M 1/08
    318/400.27

* cited by examiner

SEMICONDUCTOR DEVICE

CROSS-REFERENCE TO RELATED APPLICATIONS

The disclosure of Japanese Patent Application No. 2016-070662 filed on Mar. 31, 2016 including the specification, drawings, and abstract is incorporated herein by reference in its entirety.

BACKGROUND

The present invention relates to a semiconductor device, for example, a semiconductor device that controls a control signal to be supplied to a gate of a power device, based on slew rate control.

A motor to operate a vehicle for example requires large electric power in order to obtain large output power. Accordingly, an inverter circuit that drives such a high power motor is comprised of power elements, such as an IGBT (Insulated Gate Bipolar Transistor) that withstands a high voltage and a large current. A gate of this power element has parasitic capacitance of a large capacity. Therefore, in order to operate the power element, a gate driver to drive the gate of the power element is employed. An example of this gate driver is disclosed by Patent Literature 1.

In the technology disclosed by Patent Literature 1, a gate driving circuit to drive a power semiconductor device includes a constant current gate driving circuit that charges gate capacitance of the power semiconductor device with a constant current, and a constant voltage gate driving circuit that is coupled in parallel between the input and output ends of the constant current gate driving circuit, via a series circuit of a switching element and a resistor and that charges the gate capacitance with a constant voltage. When driving the power semiconductor device, both of the constant current gate driving circuit and the constant voltage gate driving circuit are employed to charge the gate capacitance of the power semiconductor device concerned.

(Patent Literature 1) Japanese Patent No. 4942861
Description

BACKGROUND

However, when the charge and discharge of the gate of the power element are performed, there exists a dead time that the start timing of operation of the power element is delayed to the rising timing or the falling timing of the control signal, due to the charge time and discharge time required for the gate voltage of the power element to exceed a threshold voltage. In order to shorten this dead time, it is necessary to shorten the time required for the gate voltage to reach the threshold. However, according to the technology described in Patent Literature 1, it is necessary to optimize the detection voltage that detects the gate voltage, matching well with the threshold voltage for every power element. Therefore, according to the technology described in Patent Literature 1, it is necessary to obtain matching between the threshold voltage of the power element and the circuit operation of the gate driver; however, it is difficult to perform the optimal operation of the gate driver for the power element used.

The other issues and new features of the present invention will become clear from the description of the present specification and the accompanying drawings.

According to one embodiment, a semiconductor device monitors a collector voltage of a power element when turning off the power element, and increases the number of NMOS transistors that draw out charges from a gate of the power element in a period until the collector voltage becomes lower than a determination threshold set in advance, rather than after the collector voltage becomes lower than the determination threshold.

According to the one embodiment, it is possible to provide a gate driver that performs the optimal operation for the power element, irrespective of the threshold voltage of the power element.

DETAILED DESCRIPTION

In the following description and drawings, abbreviation and simplification are properly made for the sake of clarification of explanation. In each drawing, the same symbol is attached to the same element and the repeated explanation thereof will be omitted if necessary.

Embodiment 1

A semiconductor device according to Embodiment 1 is a gate driver to drive a gate of a power element employed in an inverter circuit to drive a load circuit that requires a large amount of power, such as a high-output motor. This power element needs only to be a component of low on-resistance and a high withstand voltage, and the circuit that employs the power element is not restricted to an inverter circuit.

Figure 1:
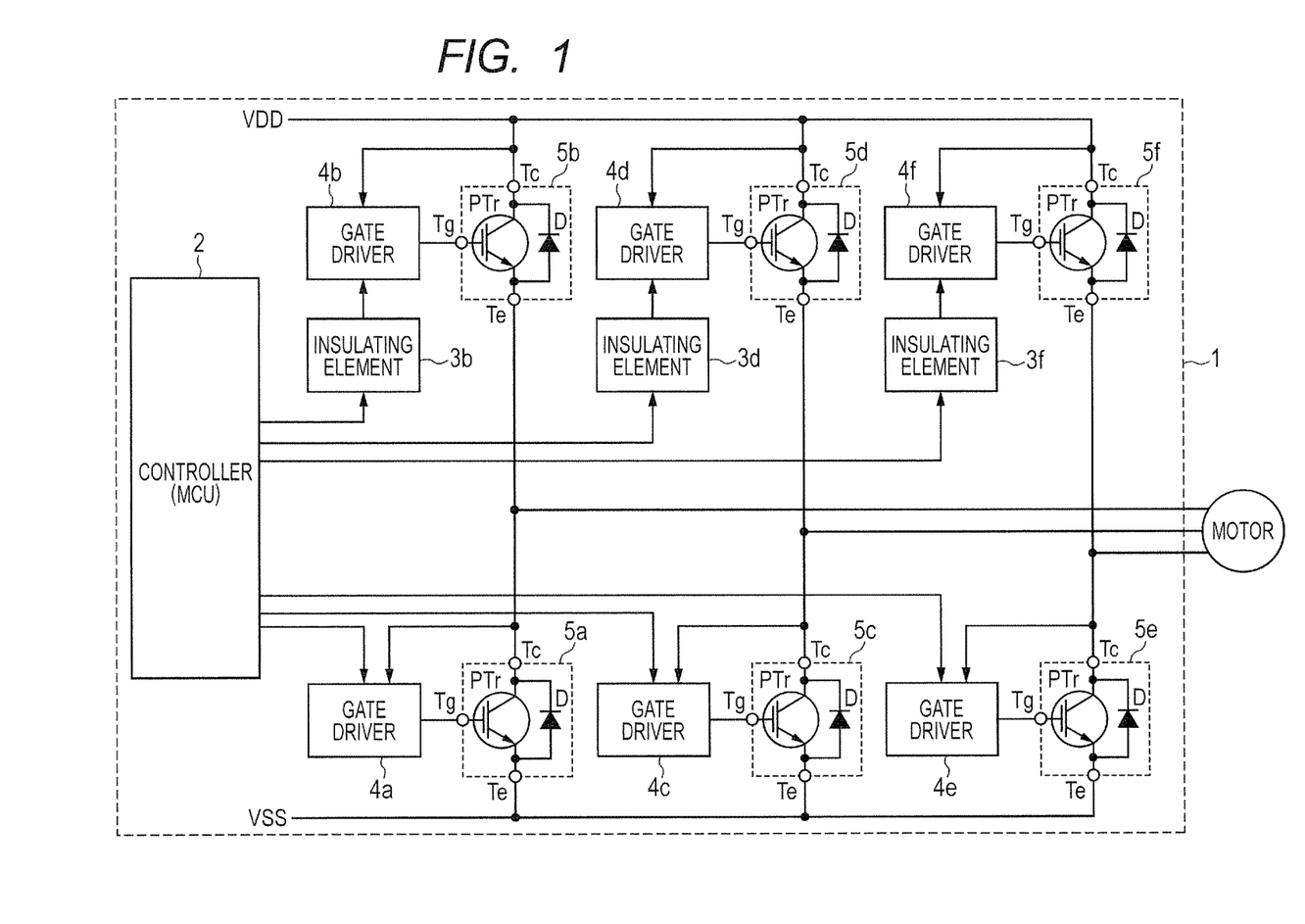
FIG. 1 is a block diagram illustrating an inverter circuit including a semiconductor device according to Embodiment 1.

FIG. 1 is a block diagram illustrating the inverter circuit that includes the semiconductor device according to Embodiment 1. In the block diagram illustrated in FIG. 1, a motor is exemplified as a load circuit of the inverter circuit. This motor is driven by a three-phase drive system. Therefore, the inverter circuit according to Embodiment 1 is a three-arm circuit.

As illustrated in FIG. 11, the inverter circuit 1 according to Embodiment 1 includes a controller 2, insulating elements 3b, 3d, and 3f, gate drivers 4a to 4f, and power elements 5a to 5f. The controller 2 outputs a gate control signal (a power device control signal in the following explanation) to be supplied to gates of the power elements 5a to 5f. This power device control signal is a PWM (Pulse Width Modulation) signal in the inverter circuit 1 according to Embodiment 1.

The controller 2 is a micro controller unit (MCU) for example, in which an arithmetic circuit to execute a program, a memory to store the program, and peripheral circuits such as an analog-to-digital converter circuit and a timer are mounted in one semiconductor package.

The insulating elements 3b, 3d, and 3f transfer the power device control signal outputted by the controller 2 to the gate drivers 4b, 4d, and 4f that operate in a different voltage range from a voltage range in the controller 2. That is, the insulating elements 3b, 3d, and 3f convert the amplitude range of the power device control signal.

The gate drivers 4a to 4f perform the charge and discharge of the gates of the power elements 5a to 5f, based on the logical level of the power device control signal. The gate drivers 4a to 4f control the charge and discharge speed to the gates of the power elements 5a to 5f, based on a collector voltage of the power elements 5a to 5f. The details of the gate drivers 4a to 4f will be described later.

Each of the power elements 5a to 5f includes a power transistor PTr and a diode D. An anode of the diode D is coupled to an emitter of the power transistor PTr and a cathode of the diode D is coupled to a collector of the power transistor PTr. Each of the power elements 5a to 5f includes a first terminal (for example, an emitter terminal Te), a second terminal (for example, a collector terminal Tc), and a control terminal (for example, a gate terminal Tg). Here, the power transistor PTr is an IGBT (Insulated Gate Bipolar Transistor) element, for example.

In the inverter circuit 1, the power elements 5a and 5b are coupled in series between a power supply wiring VDD and the ground wiring VSS to compose a first arm. The power elements 5c and 5d are coupled in series between the power supply wiring VDD and the ground wiring VSS to compose a second arm. The power elements 5e and 5f are coupled in series between the power supply wiring VDD and the ground wiring VSS to compose a third arm.

Figure 2:
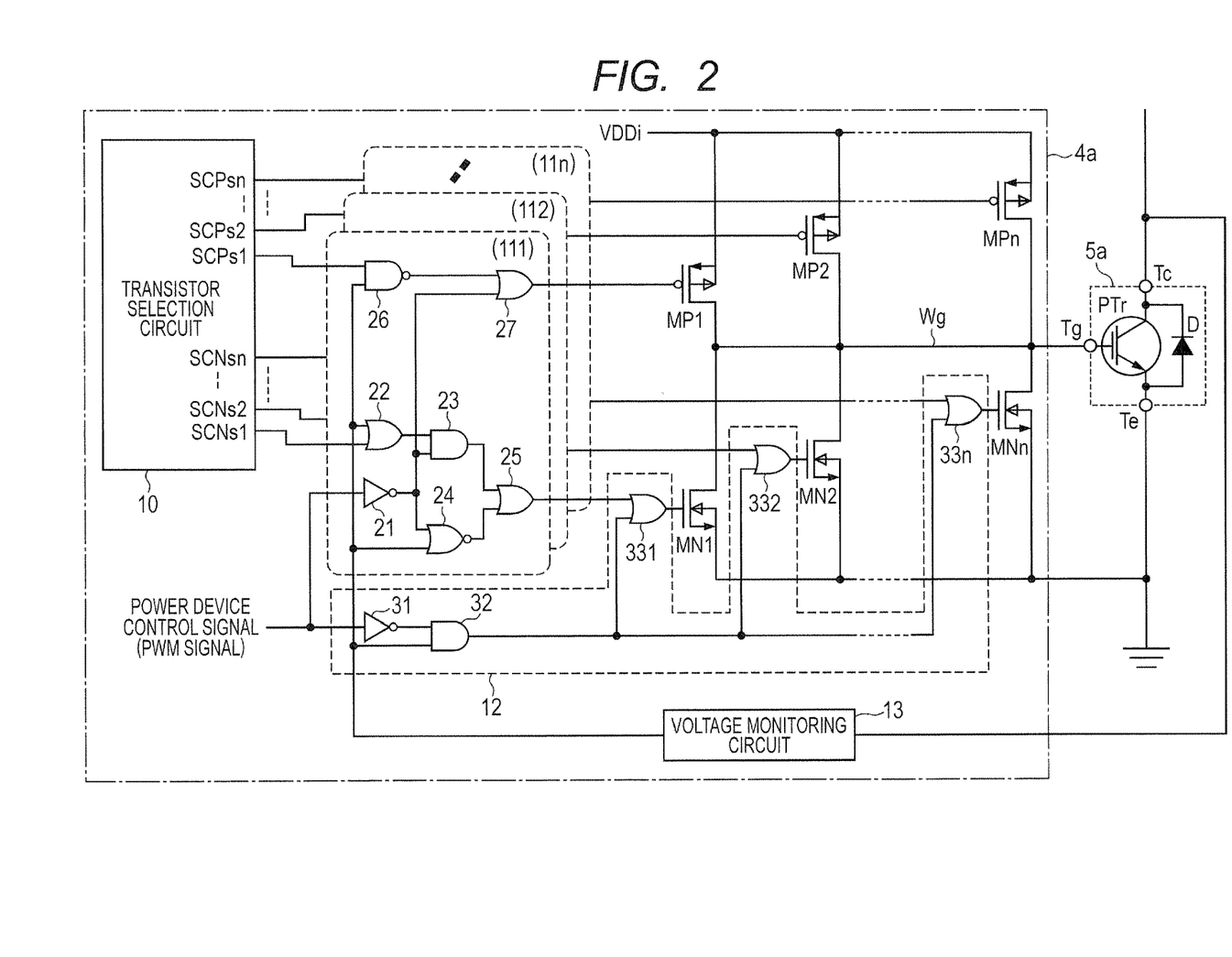
FIG. 2 is a block diagram illustrating the semiconductor device according to Embodiment 1.

Here, in the inverter circuit 1 according to Embodiment 1, the gate drivers 4a to 4f have one of the features. The gate drivers 4a to 4f have the same configuration; accordingly, the following explanation of the gate driver according to Embodiment 1 is made about the gate driver 4a as an example. FIG. 2 illustrates a block diagram of the gate driver 4a according to Embodiment 1. In FIG. 2, the power element 5a is also illustrated, in order to clarify the connection relation between the internal circuit of the gate driver 4a and the power element 5a.

As illustrated in FIG. 2, the gate driver 4a according to Embodiment 1 includes multiple PMOS transistors (in FIG. 2, the PMOS transistors MP1 to MPn, n is an integer indicating the number of the transistors) and multiple NMOS transistors (in FIG. 2, the NMOS transistors MN1 to MNn). The gate driver 4a according to Embodiment 1 includes a transistor selection circuit 10, gate mode setting circuits 111 to 11n, a pre-boost circuit 12, a voltage monitoring circuit 13, and a gate wiring Wg. The gate driver 4a according to Embodiment 1 is coupled to an internal power supply wiring VDDi and operates based on an internal power supply voltage that is different from and lower than the supply voltage of the inverter circuit 1. In the following, the internal power supply wiring VDDi is called a power supply wiring VDDi.

The gate wiring Wg is a wiring coupled to a gate of the power element 5a that includes an emitter terminal Te, a collector terminal Tc, and a gate terminal Tg.

The PMOS transistors MP1 to MPn and the NMOS transistors MN1 to MNn make a group of one PMOS transistor and one NMOS transistor. For every group, one PMOS transistor and one NMOS transistor are coupled in series between the power supply wiring VDDi and the ground wiring VSS. For example, in FIG. 2, the PMOS transistor MP1 and the NMOS transistor MN1 are coupled in series between the power supply wiring VDDi and the ground wiring VSS. In another viewpoint, the PMOS transistors MP1 to MPn are coupled between the gate wiring Wg and the power supply wiring VDDi and the NMOS transistors MN1 to MNn are coupled between the gate wiring Wg and the ground wiring VSS. In the present embodiment, the explanation is made for the example in which the number of PMOS transistors and the number of NMOS transistors are equal. However, the number of the PMOS transistors and the number of the NMOS transistors may be different.

The transistor selection circuit 10 selects a transistor to be activated among the NMOS transistors MN1 to MNn, and outputs one of activation instruction signals SCNs1 to SCNsn to the selected transistor. The activation instruction signals SCNs1 to SCNsn correspond respectively to the NMOS transistors MN1 to MNn. The transistor selection circuit 10 selects a transistor to be activated among the PMOS transistors MP1 to MPn, and outputs one of activation instruction signals SCPs1 to SCPsn to the selected transistor. The activation instruction signals SCPs1 to SCPsn correspond respectively to the PMOS transistors MP1 to MPn.

The gate mode setting circuits 111 to 11n are provided corresponding to the number of the PMOS transistors and the NMOS transistors, coupled to the gate wiring Wg. The gate mode setting circuits 111 to 11n output a gate voltage to each of the PMOS transistors and the NMOS transistors coupled to the gate wiring Wg and control the on-off state of each transistor. Among the gate voltages outputted by the gate mode setting circuits 111 to 11n, the gate voltage that controls the NMOS transistor is called a first output value, and the gate voltage that controls the PMOS transistor is called a second output value.

The gate mode setting circuits 111 to 11n control respectively the on-off state of the transistor selected by the transistor selection circuit 10, based on the gate control signal (for example, the power device control signal) that controls the on-off state of the power element 5a, and based on the activation instruction signals SCNs1 to SCNsn and SCPs1 to SCPsn. Specifically, when the power device control signal is at a high level, the gate mode setting circuits 111 to 11n supplies the gate voltage of a low level to the PMOS transistor to which the activation has been instructed by the activation instruction signals SCPs1 to SCPsn, and at the same time, supplies the gate voltage of a low level to all the NMOS transistors. When the power device control signal is at a low level, the gate mode setting circuits 111 to 11n supplies the gate voltage of a high level to the NMOS transistor to which the activation has been instructed by the activation instruction signals SCNs1 to SCNsn, and at the same time, supplies the gate voltage of a high level to all the PMOS transistors.

In a period when the collector voltage Vc of the power element 5a is determined to exceed the turn-off determination threshold in the voltage monitoring circuit 13, the pre-boost circuit 12 controls the NMOS transistors MN1 to MNn to be in the conduction state by use of the gate mode setting circuits 111 to 11n. In a period when the collector voltage is determined not to exceed the turn-off determination threshold, the pre-boost circuit 12 controls the NMOS transistors MN1 to MNn, to increase the number of the NMOS transistors in the conduction state, rather than in the period when the collector voltage Vc exceeds the turn-off determination threshold.

The voltage monitoring circuit 13 determines whether the collector voltage of the power element 5a has exceeded the turn-off determination threshold set up in advance. Specifically, the voltage monitoring circuit 13 switches the output value from a high level to a low level, when the collector voltage Vc of the power element 5a becomes higher than the turn-off determination threshold from the state where the collector voltage Vc is lower than the turn-off determination threshold.

Here, the concrete circuit of the gate mode setting circuits 111 to 11n and pre-boost circuit 12 is explained. The gate mode setting circuits 111 to 11n are the same circuits substantially. Accordingly, here, the gate mode setting circuit is explained for the gate mode setting circuit 111 as an example.

The pre-boost circuit 12 includes a NOT circuit 31, a first logical product circuit (for example, an AND circuit 32), and multiple first logical addition circuits (for example, OR circuits 331 to 33n). The NOT circuit 31 outputs the inverted signal of the power device control signal. The AND circuit 32 calculates a logical product of the inverted signal of the power device control signal and the output value of the voltage monitoring circuit 13. The OR circuits 331 to 33n are provided respectively corresponding to the NMOS transistors MN1 to MNn. The OR circuits 331 to 33n calculate respectively a logical addition of the first output value of the corresponding gate mode setting circuit and the output value of the AND circuit 32, and outputs the logical addition to the corresponding NMOS transistor.

The gate mode setting circuit 111 includes a NOT circuit 21, a second logical addition circuit (for example, an OR circuit 22), a second logical product circuit (for example, an AND circuit 23), an inverted logical addition circuit (for example, a NOR circuit 24), a third logical addition circuit (for example, an OR circuit 25), an inverted logical product circuit (for example, a NAND circuit 26), and a fourth logical addition circuit (for example, an OR circuit 27).

The NOT circuit 21 outputs an inverted signal of the power device control signal. The OR circuit 22 calculates a logical addition of an output value of the voltage monitoring circuit 13 and the activation instruction signal SCNs1. The AND circuit 23 calculates a logical product of the inverted signal of the power device control signal and an output value of the OR circuit 22. The NOR circuit 24 calculates an inverted logical addition of the inverted signal of the power device control signal and the output value of the voltage monitoring circuit 13. The OR circuit 25 calculates a logical addition of an output value of the AND circuit 23 and an output value of the NOR circuit 24, and outputs the calculated logical addition as a first output value of the gate mode setting circuit 111.

The NAND circuit 26 calculates an inverted logical product of the activation instruction signal SCPs1 and the output value of the voltage monitoring circuit 13. The OR circuit 27 calculates a logical addition of an output value of the NAND circuit 26 and the inverted signal of the power device control signal, and outputs the calculated logical addition as a second output value of the gate mode setting circuit 111.

Figure 3:
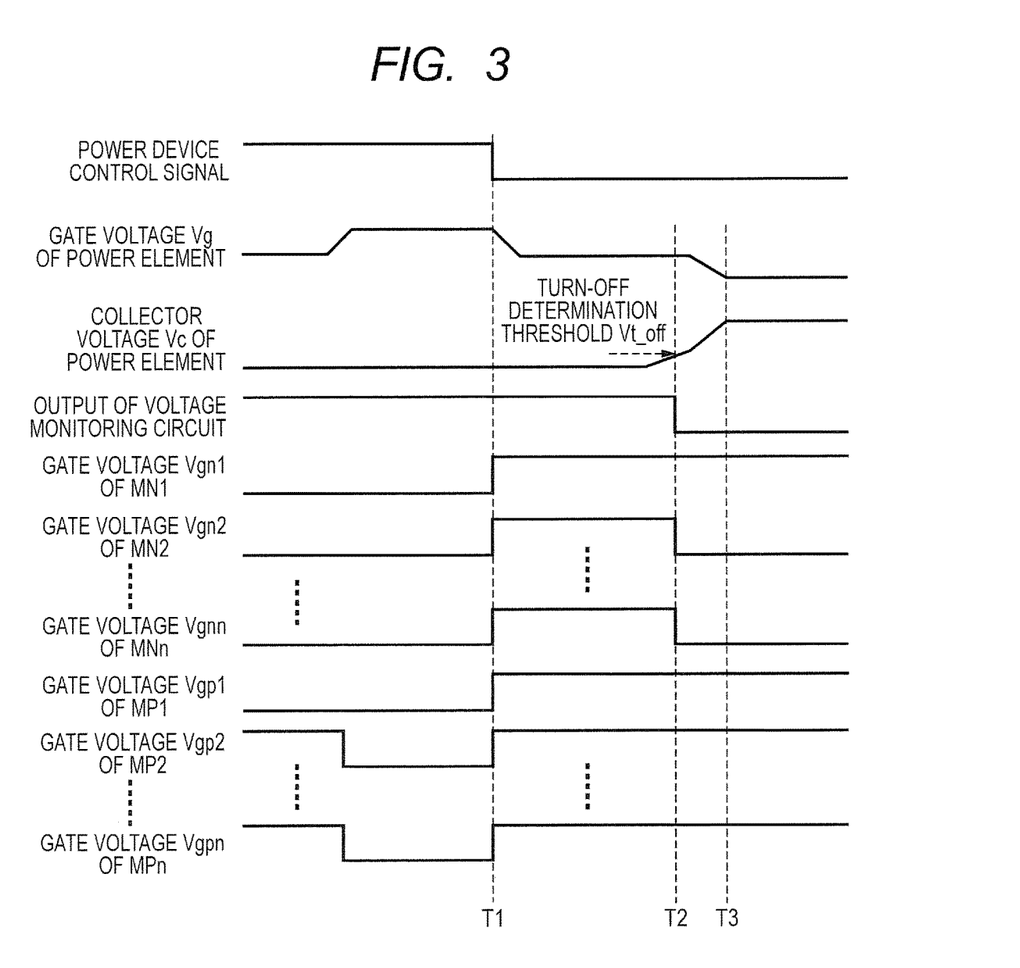
FIG. 3 is a timing chart explaining operation of the semiconductor device according to Embodiment 1.

Next, the operation of the gate driver according to Embodiment 1 is explained. FIG. 3 illustrates a timing chart explaining the operation of the gate driver according to Embodiment 1. In the example illustrated in FIG. 3, the transistor selection circuit 10 selects only the NMOS transistor MN1 and the PMOS transistor MP1 as the activation target. In the gate driver 4a according to Embodiment 1, one of the features is the operation at the time of turning off the power element 5a. Accordingly, FIG. 3 illustrates the operation at the time of turning off the power element 5a.

As illustrated in FIG. 3, when the power device control signal changes from a high level to a low level (timing T1), the gate driver 4a according to Embodiment 1 switches the gate voltage Vgp1 of the PMOS transistor MP1, which has been set to a low level till then by the gate mode setting circuit 111, from the low level to a high level. Accordingly, all the PMOS transistors MP1 to MPn are set to the OFF state.

The power element 5a has been turned on in the period before timing T1; accordingly, the collector voltage Vc is lower than the turn-off determination threshold Vt_off at timing T1. Therefore, at timing T1, the voltage monitoring circuit 13 outputs the output value of a high level. Accordingly, in the gate driver 4a according to Embodiment 1, at timing T1, the gate mode setting circuits 111 to 11n set at a high level all the gate voltages to be supplied to the NMOS transistors MN1 to MNn.

Then, when drawing out of charges from the gate of the power element 5a is performed by the NMOS transistors MN1 to MNn, the power element 5a approaches an OFF state, and the collector voltage Vc exceeds the turn-off determination threshold Vt_off (timing T2). At timing T2, responding to the switching of the output value of the voltage monitoring circuit 13 from a high level to a low level, the gate mode setting circuits 111 to 11n switch the gate voltage to be supplied to the NMOS transistor to which activation is not instructed, from a high level to a low level. Accordingly, at timing T2 or later, the drawing out of charges from the gate of the power element 5a is performed by only the NMOS transistor MN1 to which the activation has been instructed. Then, the collector voltage Vc of the power element 5a rises following the decrease of the gate voltage of the power element 5a, and the turn-off operation is completed at timing T3.

As explained above, the gate driver according to Embodiment 1 performs the pre-boost operation in which the number of the NMOS transistors that drive the gate of the power element is increased based on the collector voltage of the power element as the control target. Then, the gate driver according to Embodiment 1 can shorten the length of the period of timing T1 to T2 illustrated in FIG. 3 by performing the pre-boost operation. That is, by performing the pre-boost operation, the gate driver according to Embodiment 1 can shorten the dead time as a difference between the timing when the logical level of the power device control signal changes and the timing when the power element turns off.

Here, the collector voltage Vc of the power element changes based on the activated state of the power transistor PTr. Therefore, the collector voltage Vc of the power element reflects the activated state of the power transistor PTr more correctly in comparison with the relation between the gate voltage of the power transistor PTr and the threshold voltage of the power transistor PTr, in determining the activated state of the power transistor PTr.

Therefore, by employing the gate driver according to Embodiment 1, it is possible to set the end timing of the pre-boost operation corresponding to the activated state of the power transistor PTr, irrespective of the variations in the threshold voltage of the power transistor PTr. That is, by employing the gate driver according to Embodiment 1, it is possible to keep constant the end timing of the pre-boost operation corresponding to the activated state of the power transistor PTr, irrespective of the variations in the threshold voltage of the power transistor PTr. Furthermore, by employing the gate driver according to Embodiment 1, it is not necessary to perform the tuning of the circuit depending on the variations in the threshold voltage of the power transistor PTr.

The power element and the gate driver are manufactured by different manufacturing processes in many cases. The power element and the gate driver may be prepared separately by the user. Therefore, the variations in the threshold voltage of the power element have no connection with the circuit constants in the gate driver. Therefore, it is difficult to tune up the circuit constants of the gate driver depending on the threshold voltage of the power element. However, the employment of the gate driver according to Embodiment 1 eliminates the need for this tuning. Accordingly, it is possible to exclude the processes otherwise required for matching of the power element and the power device.

Embodiment 2

Figure 4:
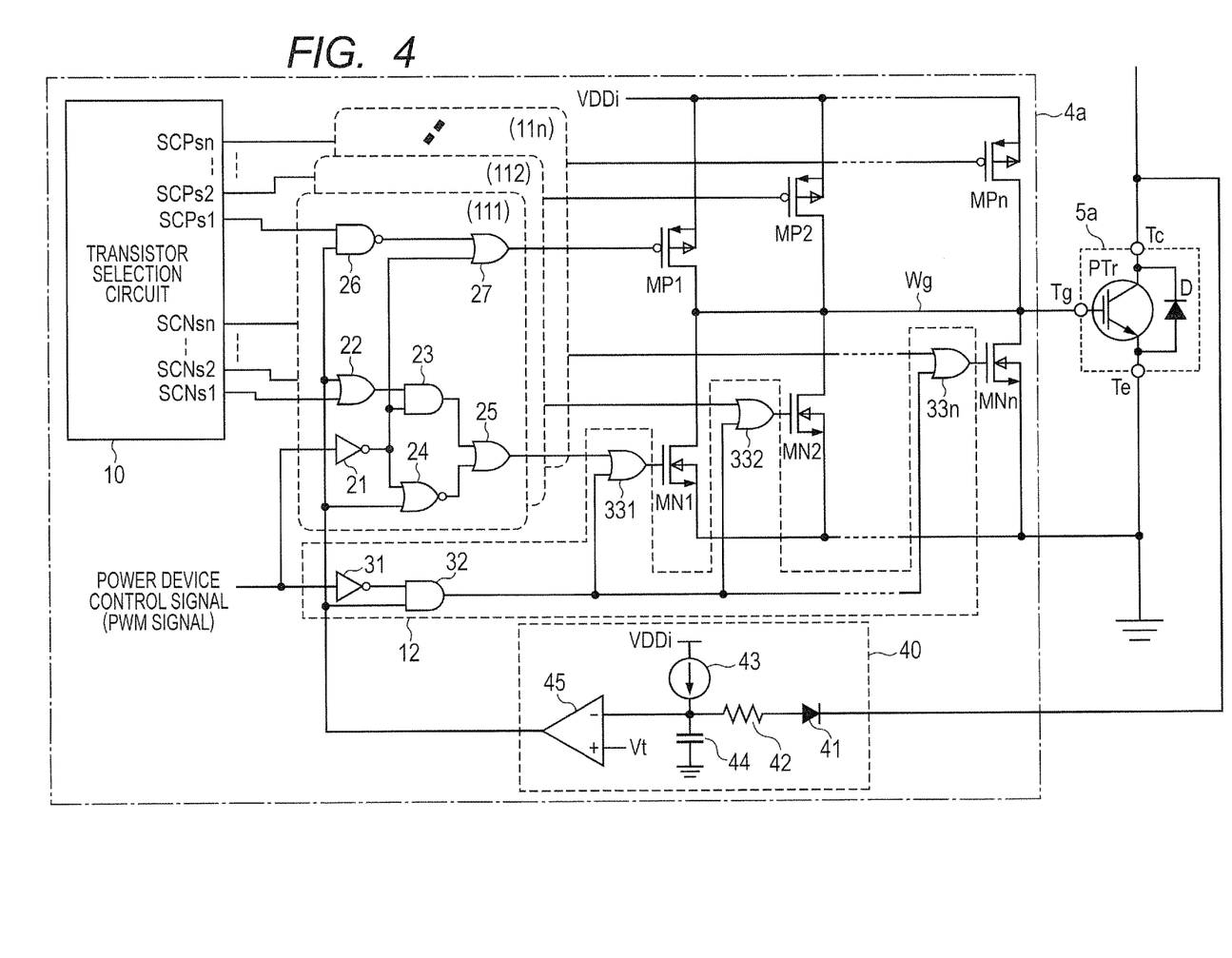
FIG. 4 is a block diagram illustrating a semiconductor device according to Embodiment 2.

In Embodiment 2, an example of the concrete circuit of the voltage monitoring circuit 13 is explained. In Embodiment 2, the voltage monitoring circuit 13 employs an unsaturated protection circuit (hereinafter called a DESAT (DE-SATuration) circuit) that detects a short-to-supply fault state in which a collector terminal Tc of a power element short-circuits with the power supply wiring VDD. FIG. 4 is a block diagram illustrating a gate driver according to Embodiment 2 that employs the DESAT circuit 40 as the voltage monitoring circuit 13.

As illustrated in FIG. 4, the DESAT circuit 40 includes a diode 41, a resistor 42, a constant current source 43, a capacitor 44, and a comparator 45.

The diode 41 has a cathode terminal coupled to a collector terminal of the power element and an anode terminal coupled to the one end of the resistor 42. The resistor 42 is coupled between the anode terminal of the diode 41 and an inverted input terminal of the comparator 45. A determination threshold Vt is inputted into a non-inverted input terminal of the comparator, and the comparator 45 switches the logical level of the output value thereof (for example, a determination signal) based on the magnitude relation of the determination threshold Vt and a voltage at the inverted input terminal. The constant current source 43 is coupled between the inverted input terminal of the comparator 45 and the power supply wiring VDDi. The capacitor 44 is coupled between the inverted input terminal of the comparator 45 and the ground wiring VSS.

The DESAT circuit 40 detects whether the collector terminal of the power element has become in the short-to-supply fault state. When the short-to-supply fault state is detected, the DESAT circuit 40 switches the determination signal from a high level to a low level. Therefore, in the gate driver 4a according to Embodiment 2, when the DESAT circuit 40 detects the short-to-supply fault state, the gate mode setting circuit 111 switches the NMOS transistors MN1 to MNn to an ON state and switches the PMOS transistors MP1 to MPn to an OFF state, irrespective of the logical level of the power device control signal.

Figure 5:
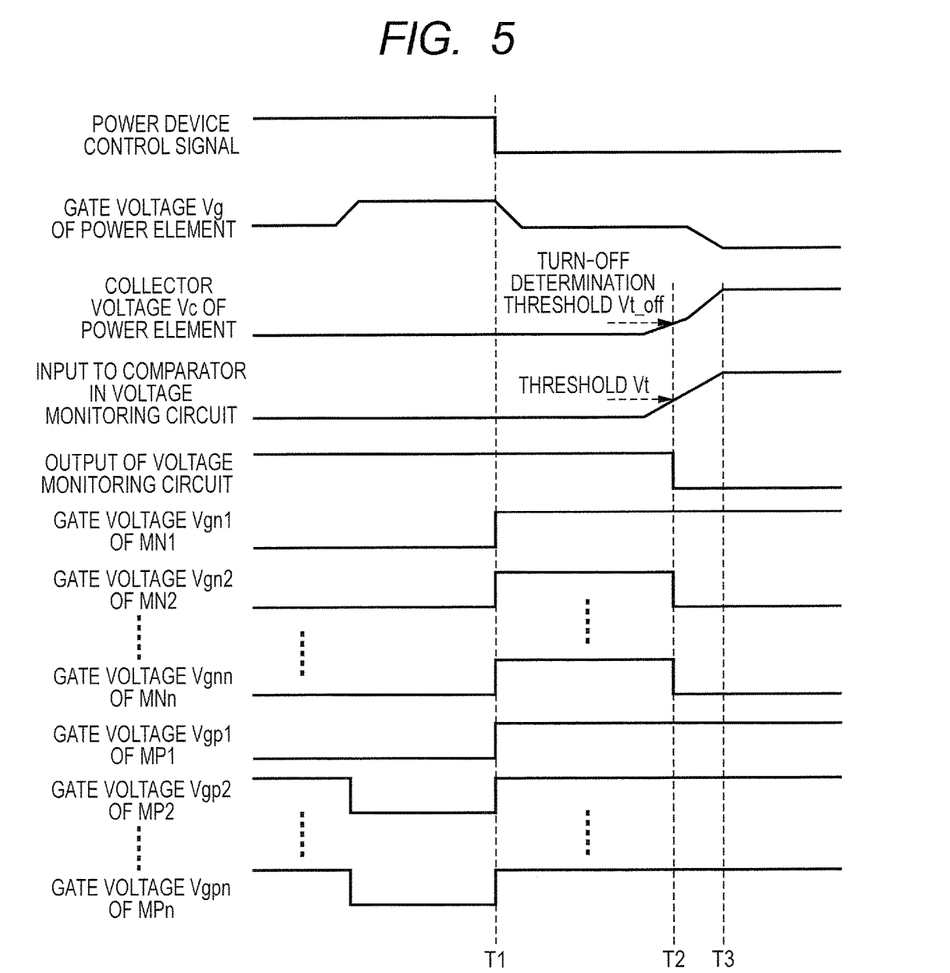
FIG. 5 is a timing chart explaining ordinary operation of the semiconductor device according to Embodiment 2.

Next, the operation of the gate driver according to Embodiment 2 is explained. FIG. 5 illustrates a timing chart explaining the operation at the time of the normal operation in which no short-to-supply fault occurs in the gate driver according to Embodiment 2. The timing chart illustrated in FIG. 5 adds the timing chart of the input voltage of the comparator 45 to the timing chart illustrated in FIG. 3, and the operation is the same as the gate driver according to Embodiment 1.

As illustrated in FIG. 5, in the DESAT circuit 40, when the power element is turned off, the collector voltage Vc of the power element rises gradually from a low level. Therefore, in the DESAT circuit 40, the electric current supplied to the capacitor 44 by the constant current source 43 is drawn out by the collector of the power element until the collector voltage Vc rises to some extent. Then, when the collector voltage Vc rises to some extent and the electric charging of the capacitor 44 advances, the input voltage of the comparator 45 exceeds the determination threshold Vt_off. Here, the collector voltage Vc at the moment when the input voltage of the comparator 45 exceeds the determination threshold Vt becomes a turn-off determination threshold Vt_off.

Figure 6:
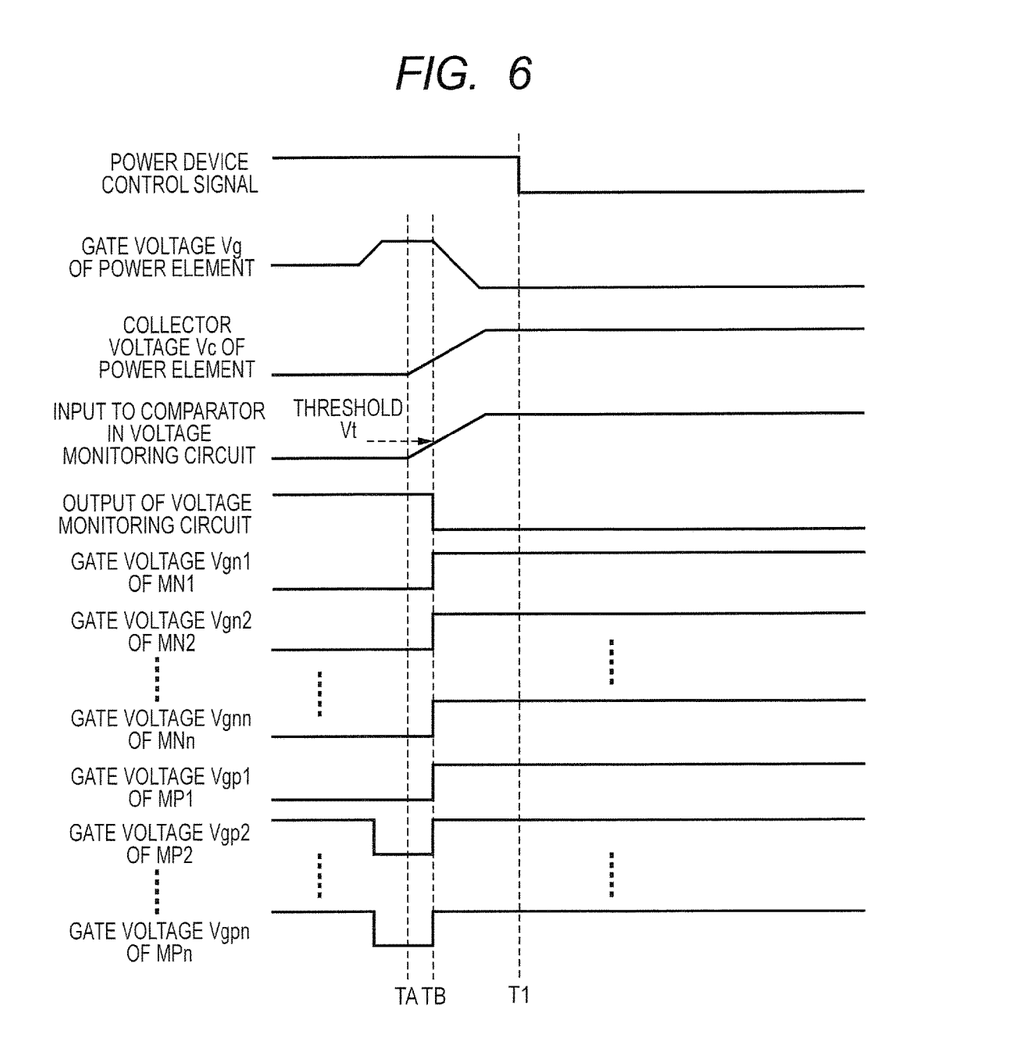
FIG. 6 is a timing chart explaining operation of the semiconductor device according to Embodiment 2 when a short-to-supply fault of a power element occurs in an inverter circuit.

Next, FIG. 6 illustrates a timing chart explaining the operation of the gate driver according to Embodiment 2 when the short-to-supply fault occurs. The example illustrated in FIG. 6 is the case where the short-to-supply fault occurs at timing TA in the period when the power element is in an ON state.

As illustrated in FIG. 6, when the short-to-supply fault occurs in the period when the power element 5 is in the ON state (timing TA), the collector voltage Vc rises. Therefore, in the DESAT circuit 40, the input voltage of the comparator 45 rises following the rise of the collector voltage Vc. Then, at the moment when the input voltage of the comparator 45 exceeds the determination threshold Vt (timing TB), the DESAT circuit 40 sets the determination signal at a low level.

Accordingly, the gate mode setting circuits 111 to 11n switch the gate signal, which is supplied to the PMOS transistor MP1 and has been set at the low level until then, to a high level from the low level at timing TB. At timing TB, the gate mode setting circuits 111 to 11n switch also the gate signal supplied to the PMOS transistors MP2 to MPn to a high level.

At timing TB, the gate mode setting circuits 111 to 11n switch the output of the NOR circuit 24 from a low level to a high level, responding to the determination signal of the DESAT circuit 40 that has changed from a high level to a low level. Accordingly, at timing TB, the gate voltage supplied to the NMOS transistors MN1 to MNn is switched from a low level to a high level. Therefore, at timing TB or later, the gate voltage of the power element is maintained at a voltage that brings the power element into the OFF state. In this way, the power element 5a becomes in the OFF state; consequently, it is possible to prevent an excessive current due to the short-to-supply fault from flowing through the power element 5a.

As explained above, in the gate driver according to Embodiment 2, the DESAT circuit 40 is employed in lieu of the voltage monitoring circuit 13. Even when the DESAT circuit 40 is employed, it is possible to perform the pre-boost operation that is realized by the pre-boost circuit 12 and the DESAT circuit 40, as is the case with the gate driver according to Embodiment 1.

Furthermore, in Embodiment 2, it is possible to protect the power element from the short-to-supply fault state, by employing the DESAT circuit 40 as the voltage monitoring circuit 13. This DESAT circuit 40 is provided regardless of the pre-boost operation. If the gate driver includes the DESAT circuit 40 from the beginning, it is possible to perform the same pre-boost operation as the gate driver according to Embodiment 1, by adding the pre-boost circuit 12. That is, by employing the gate driver according to Embodiment 2, it is possible to reduce an additional circuit and to perform the pre-boost operation as is the case with Embodiment 1.

Embodiment 3

Figure 7:
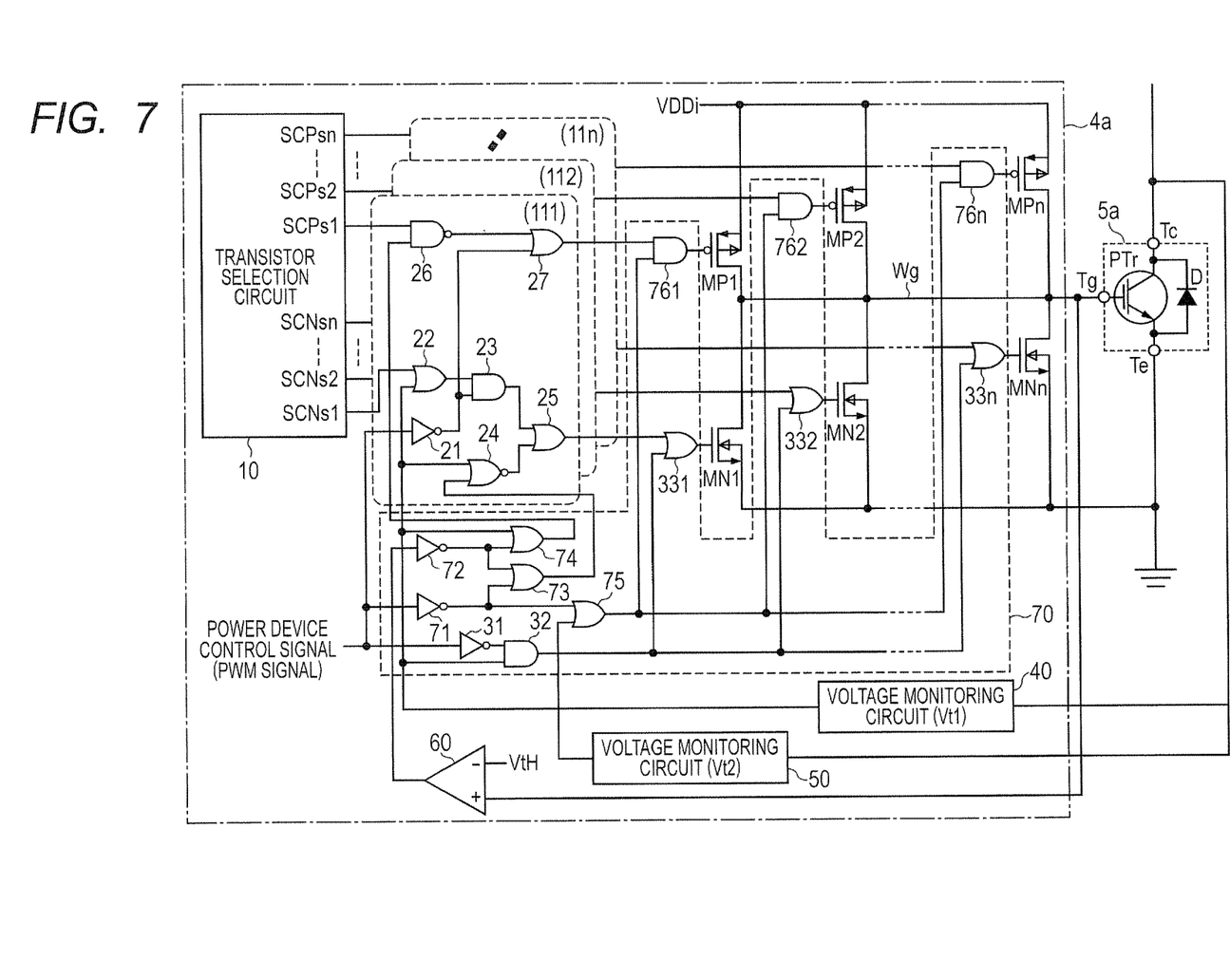
FIG. 7 is a block diagram illustrating a semiconductor device according to Embodiment 3.

In Embodiment 3, a modified example of the gate driver according to Embodiment 2 is explained. In this modified example, in addition to the pre-boost operation when the power element is turned off, a pre-boost operation is also performed when the power element is turned on. FIG. 7 illustrates a block diagram of a gate driver according to Embodiment 3.

As illustrated in FIG. 7, the gate driver 4a according to Embodiment 3 includes a pre-boost circuit 70 in lieu of the pre-boost circuit 12. The gate driver 4a according to Embodiment 3 employs the DESAT circuit 40 as a first voltage monitoring circuit. The gate driver 4a according to Embodiment 3 further includes a second voltage monitoring circuit (for example, a voltage monitoring circuit 50) and a voltage comparator 60.

The voltage monitoring circuit 50 determines whether the collector voltage Vc of the power element 5a has exceeded a turn-on determination threshold Vt_on set up in advance. Specifically, the voltage monitoring circuit 50 switches the output value thereof from a low level to a high level when the collector voltage Vc of the power element 5a changes from a voltage higher than a turn-on determination threshold Vt_on to a voltage lower than the turn-on determination threshold Vt_on. The voltage monitoring circuit 50 includes a voltage comparator and outputs a collector voltage determination signal. The logical level of the collector voltage determination signal is switched based on the magnitude relation of the collector voltage Vc of the power element 5a and a voltage threshold Vt2 of a pre-set voltage value.

Figure 8:
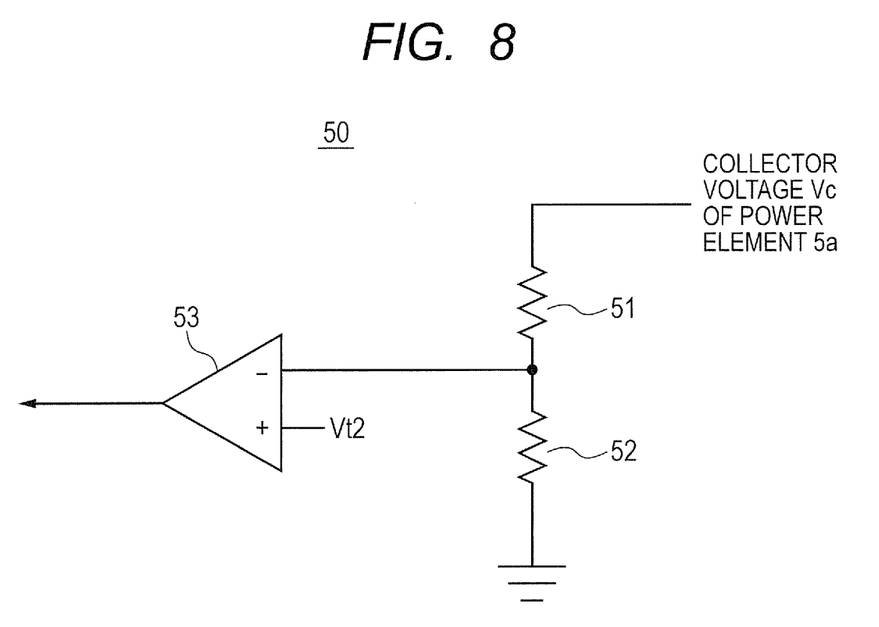
FIG. 8 is a block diagram illustrating a second voltage monitoring circuit of the semiconductor device according to Embodiment 3.

FIG. 8 illustrates a block diagram of the voltage monitoring circuit 50. As illustrated in FIG. 8, the voltage monitoring circuit 50 includes resistors 51 and 52 and a comparator 53. The comparator 53 has a non-inverted input terminal supplied with a determination threshold Vt2 corresponding to the turn-on determination threshold Vt_on, and an inverted input terminal supplied with a voltage obtained by subdividing the collector voltage Vc of the power element 5a by the resistors 51 and 52. In the voltage monitoring circuit 50, the comparison between the collector voltage Vc and the determination threshold Vt2 is enabled in the working range of the comparator 53, by subdividing the collector voltage Vc by the resistors 51 and 52. In the gate driver 4a according to Embodiment 3, the determination threshold Vt employed by the DESAT circuit 40 is called a determination threshold Vt1.

As illustrated in FIG. 7, the voltage comparator 60 outputs a gate voltage determination signal of which the logical level is switched, based on the magnitude relation between the gate voltage of the power element 5a and a gate voltage determination threshold VtH of a voltage value set in advance.

The pre-boost circuit 70 includes a first logical product circuit (for example, an AND circuit 32), multiple first logical addition circuits (for example, an OR circuits 331 to 33n), a first logical addition circuit (for example, an OR circuit 75), multiple second logical product circuits (for example, AND circuits 761 to 76n), a second logical addition circuit (for example, an OR circuit 73), and a third logical addition circuit (for example, an OR circuit 74). The pre-boost circuit 60 further includes NOT circuits 31, 71, and 72.

The NOT circuit 31 outputs an inverted signal of the power device control signal. The AND circuit 32 calculates a logical product of the inverted signal of the power device control signal and an output value of the DESAT circuit 40. The OR circuits 331 to 33n are provided for every multiple NMOS transistors. Each of the OR circuits 331 to 33n calculates a logical addition of the first output value (a gate voltage supplied to the NMOS transistor) of the corresponding gate mode setting circuits 111 to 11n and an output value of the AND circuit 32, and supplies the calculated output value to the corresponding NMOS transistor.

The OR circuit 75 calculates a logical addition of an inverted signal of the gate control signal and an inverted value of the output value of the second voltage monitoring circuit. The AND circuits 761 to 76n are provided for every multiple PMOS transistors. Each of the AND circuits 761 to 76n calculates a logical product of the second output value (a gate voltage supplied to the PMOS transistor) of the corresponding gate mode setting circuits 111 to 11n and an output value of the OR circuit 75, and supplies the calculated output value to the corresponding PMOS transistor.

The NOT circuit 71 outputs an inverted signal of the power device control signal. The NOT circuit 72 outputs an inverted signal of the gate voltage determination signal outputted by the voltage comparator 60. The OR circuit 73 calculates a logical addition of an inverted signal of the gate voltage determination signal and an inverted signal of the power device control signal. The OR circuit 74 calculates a logical addition of an inverted signal of the gate voltage determination signal and an output value of the DESAT circuit 40.

The gate mode setting circuits 111 to 11n according to Embodiment 3 include the following circuit configurations. Each of the gate mode setting circuits 111 to 11n includes a first logic circuit group and a second logic circuit group. The first logic circuit group includes a NOT circuit 21, a fourth logical addition circuit (for example, an OR circuit 22), a third logical product circuit (for example, an AND circuit 23), an inverted logical addition circuit (for example, a NOR circuit 24), and a fifth logical addition circuit (for example, an OR circuit 25). The second logic circuit group includes an inverted logical product circuit (for example, a NAND circuit 26) and a sixth logical addition circuit (for example, an OR circuit 27).

The NOT circuit 21 outputs an inverted signal of the power device control signal. The OR circuit 22 calculates a logical addition of the output value of the DESAT circuit 40 and the activation instruction signal. The AND circuit 23 calculates a logical product of the inverted signal of the power device control signal and an output value of the OR circuit 22. The NOR circuit 24 calculates an inverted logical addition of an output value of the OR circuit 73 of the pre-boost circuit 70 and the output value of the DESAT circuit 40. The OR circuit 25 calculates a logical addition of an output value of the AND circuit 23 and an output value of the NOR circuit 24, and outputs the calculated logical addition as a first output value of the gate mode setting circuit 111.

The NAND circuit 26 calculates an inverted logical product of the activation instruction signal and the output value of the pre-boost circuit 70. The OR circuit 27 calculates a logical addition of an output value of the NAND circuit 26 and the inverted signal of the power device control signal, and outputs the calculated logical addition as a second output value of the gate mode setting circuit 111.

Figure 9:
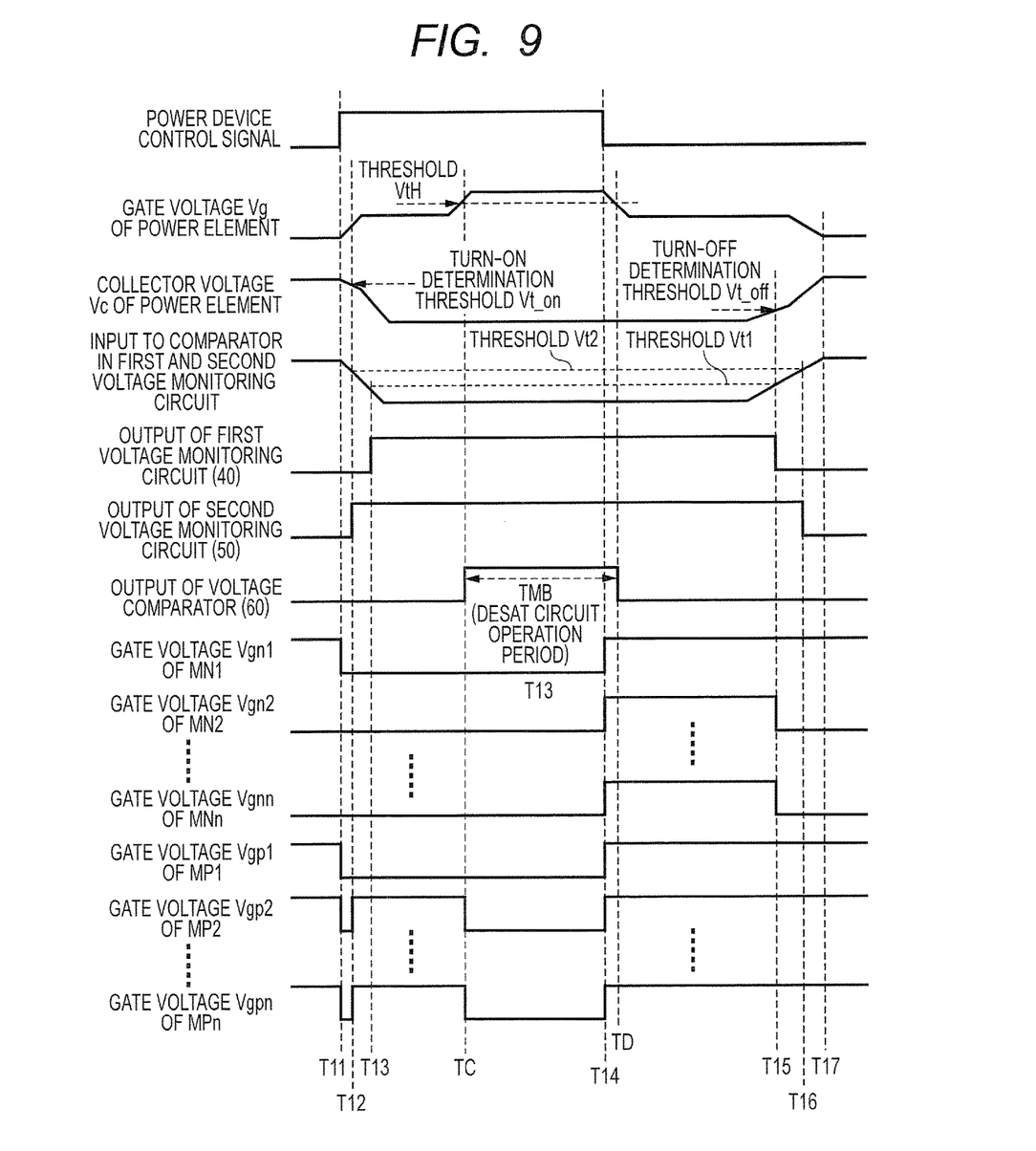
FIG. 9 is a timing chart explaining operation of the semiconductor device according to Embodiment 3.

Next, the operation of the gate driver 4a according to Embodiment 3 is explained. FIG. 9 illustrates a timing chart explaining the operation of the gate driver 4a according to Embodiment 3. In the example illustrated in FIG. 9, in addition to the operation of the gate driver 4a when the power element 5a is turned off, the operation of the gate driver 4a when the power element 5a is turned on is also shown.

As illustrated in FIG. 9, the gate driver 4a according to Embodiment 3 switches the power device control signal from a low level to a high level, when turning on the power element 5a (timing T11). At timing T11, the collector voltage Vc is higher than the turn-on determination threshold Vt_on, since the power element 5a has been turned off before timing T11. Therefore, at timing T11, the DESAT circuit 40 and the voltage monitoring circuit 50 output the output value of a low level. On the other hand, at timing T11, the gate voltage Vg of the power element 5a does not yet rise, but is lower than the gate voltage determination threshold VtH. Therefore, at timing T11, the gate voltage determination signal outputted by the voltage comparator 60 is at a low level.

Accordingly, in the gate driver 4a according to Embodiment 3, at timing T11, all the gate voltages that the gate mode setting circuits 111 to 11n supply to the NMOS transistors MN1 to MNn are set at a low level. The gate voltage determination signal outputted by the voltage comparator 60 is at a low level. Therefore, all the gate voltages that the pre-boost circuit 70 supplies to the PMOS transistors MP1 to MPn are set at a low level. At timing T11 or later, as the gate voltage Vg rises and the power element 5a approaches the ON state, the collector voltage Vc of the power element 5a also falls.

Subsequently, at timing T12, when the collector voltage Vc of the power element 5a becomes lower than the turn-on determination threshold Vt_on, the voltage monitoring circuit 50 switches the output value thereof from a low level to a high level. Accordingly, the gate mode setting circuits 111 to 11n set at a low level only the gate voltage supplied to the PMOS transistor MP1 to which the activated state is instructed, and set at a high level the gate voltage supplied to the other PMOS transistors. Accordingly, at timing T12 or later, the electric charging to the gate of the power element 5a is performed by the PMOS transistor MP1.

Here, the turn-on determination threshold Vt_on is explained. As illustrated in FIG. 9, in the gate driver 4a according to Embodiment 3, when the power element 5a is turned on, the collector voltage Vc of the power element falls gradually from a high value. Following the fall of the collector voltage Vc, the input voltage of the comparator 53 of the voltage monitoring circuit 50 falls. Therefore, the determination threshold Vt2 is set up so that the collector voltage Vc at the moment when the input voltage of the comparator 53 becomes lower than the determination threshold Vt2 may be defined as the turn-on determination threshold Vt_on.

Next, at timing T12 or later, when the electric charging to the gate of the power element 5a advances and the gate voltage Vg becomes lower than the determination threshold Vt1, the DESAT circuit 40 switches the output value thereof from a low level to a high level (timing T13).

Next, at timing T13 or later, when the electric charging to the gate of the power element 5a advances and the gate voltage Vg exceeds the gate voltage determination threshold VtH, the gate voltage determination signal outputted by the voltage comparator 60 changes from a low level to a high level (timing TC). Here, in the gate driver 4a according to Embodiment 3, responding to the fact that the gate voltage determination signal has changed to a high level or the fact that both the output value of the DESAT circuit 40 and the output value of the voltage monitoring circuit 50 have changed to a high level, the activation instruction signals SCPs1 to SCPsn of the transistor selection circuit 10 are set at a high level (at timing TC when the gate voltage determination signal becomes at a high level in the example illustrated in FIG. 9). Then, at this timing TC, by setting the activation instruction signals SCPs1 to SCPsn of the transistor selection circuit 10 to a high level, the gate voltage to be supplied to the PMOS transistors MP1 to MPn becomes at a low level, and all the PMOS transistors MP1 to MPn become in the ON state. At timing TC, the output values of the OR circuit 25 and the OR circuit 27 become ready to change according to the logical level of the output value of the DESAT circuit 40.

Subsequently, at timing T14, when the power device control signal changes from a high level to a low level, based on the operation explained at timing T1 to T3 of the timing chart illustrated in FIG. 3, the turn-off operation to decrease the gate voltage of the power element 5a is performed (at timing T14 to T18). At timing T15 or later, the gate voltage falls. Accordingly, at timing TD when the gate voltage of the power element 5a becomes lower than the gate voltage determination threshold VtH, the gate voltage determination signal outputted by the voltage comparator 50 changes from a high level to a low level. This period of timing TC to TD is the operation period of the DESAT circuit to protect the power element 5a from the short-to-supply fault state with the aid of the operation of the DESAT circuit 40.

The timing chart illustrated in FIG. 9 shows that the output value of the DESAT circuit 40 changes from a high level to a low level at timing T16 when the collector voltage Vc of the power element 5a becomes higher than the turn-off determination threshold Vt_off. The timing chart illustrated in FIG. 9 also shows that the output value of the voltage monitoring circuit 50 changes from a high level to a low level at timing T17 when the collector voltage Vc of the power element 5a becomes higher than the turn-on determination threshold Vt_on.

As explained above, in the gate driver 4a according to Embodiment 3, by employing the voltage monitoring circuit 50, the voltage comparator 60, and the pre-boost circuit 70, it is possible to perform the pre-boost operation for electric charging to the gate by use of the transistors including the PMOS transistor to which the activation is not instructed, when the power element 5a is turned on.

By employing the voltage monitoring circuit 50, the voltage comparator 60, and the pre-boost circuit 70, it is possible to make the DESAT circuit 40 operate only in the period when the DESAT circuit 40 should operate. Accordingly, it is possible to prevent the malfunction in which the DESAT circuit 40 may operate in the unintended period and which may cause a failure in the control of the power element 5a.

As described above, the invention accomplished by the present inventors has been concretely explained based on the embodiments. However, it cannot be overemphasized that the present invention is not restricted to the embodiments as described above, and it can be changed variously in the range that does not deviate from the gist.

For example, the gate driver 4a explained in the embodiments can be applied also to the power elements other than IGBTs.

What is claimed is:

1. A semiconductor device comprising:
a gate wiring coupled to a gate of a power element including a first terminal, a second terminal, and a control terminal;
a plurality of NMOS transistors coupled between the gate wiring and a ground wiring;
a transistor selection circuit that selects a transistor to be activated among the NMOS transistors, and that outputs an activation instruction signal to the selected transistor;
a gate mode setting circuit that controls the on-off state of the transistor selected by the transistor selection circuit, based on a gate control signal to control the on-off state of the power element and on the activation instruction signal;
a first voltage monitoring circuit that determines whether a voltage of the second terminal has exceeded a turn-off determination threshold set in advance; and
a pre-boost circuit that controls the NMOS transistors to be in a conduction state, by use of the gate mode setting circuit, in a period when the voltage of the second terminal is determined to exceed the turn-off determination threshold in the first voltage monitoring circuit, and that controls the NMOS transistors so as to increase the number of the NMOS transistors controlled in a conduction state, in a period when the voltage of the second terminal is determined not to exceed the turn-off determination threshold, rather than the number of the NMOS transistors controlled in a conduction state in the period when the voltage of the second terminal exceeds the turn-off determination threshold.

2. The semiconductor device according to claim 1, further comprising:
a plurality of PMOS transistors coupled between the gate wiring and a power supply wiring,
wherein the transistor selection circuit selects a transistor to be activated among the NMOS transistors and the PMOS transistors, and outputs an activation instruction signal to the selected transistor.

3. The semiconductor device according to claim 1,
wherein the first voltage monitoring circuit is an unsaturated protection circuit that detects a short-to-supply fault state in which the second terminal of the power element short-circuits with the power supply wiring.

4. The semiconductor device according to claim 3,
wherein the gate mode setting circuit switches the NMOS transistors to an ON state irrespective of the logical level of the gate control signal, responding to the detection of the short-to-supply fault state in the first voltage monitoring circuit.

5. The semiconductor device according to claim 1,
wherein the first voltage monitoring circuit comprises:
a diode with a cathode terminal coupled to the second terminal of the power element;
a resistor with one end coupled to an anode terminal of the diode;
a comparator that has an inverted input terminal coupled to the other end of the resistor and a non-inverted input terminal supplied with a determination threshold and that switches the logical level of a determination signal based on the magnitude relation of the determination threshold and a voltage at the inverted input terminal;
a constant current source coupled between the inverted input terminal of the comparator and the power supply wiring; and
a capacitor coupled between the inverted input terminal of the comparator and the ground wiring.

6. The semiconductor device according to claim 1,
wherein the gate mode setting circuit outputs one output value to each of the NMOS transistors, and
wherein the pre-boost circuit comprises:
a first logical product circuit that calculates a logical product of an inverted signal of the gate control signal and an output value of the first voltage monitoring circuit; and
a plurality of first logical addition circuits, each provided for each of the NMOS transistors, and each calculating a logical addition of the output value of the corresponding gate mode setting circuit and an output value of the first logical product circuit.

7. The semiconductor device according to claim 6,
wherein the gate mode setting circuit is provided for each of the NMOS transistors, and
wherein the gate mode setting circuit comprises:
a second logical addition circuit that calculates a logical addition of the output value of the first voltage monitoring circuit and the activation instruction signal;
a second logical product circuit that calculates a logical product of an output value of the second logical addition circuit and the inverted signal of the gate control signal;
an inverted logical addition circuit that calculates an inverted logical addition of the output value of the first voltage monitoring circuit and the inverted signal of the gate control signal; and
a third logical addition circuit that calculates a logical addition of an output value of the second logical product circuit and the output value of the inverted logical addition circuit and that outputs the calculated logical addition as an output value of the gate mode setting circuit.

8. The semiconductor device according to claim 2, further comprising:
a second voltage monitoring circuit that determines whether the voltage of the second terminal has exceeded a turn-on determination threshold higher than the turn-off determination threshold; and
a voltage comparator that outputs a gate voltage determination signal of which the logical level is switched based on the magnitude relation between a gate voltage of the power element and a gate voltage determination threshold with a voltage value set in advance,
wherein the gate mode setting circuit outputs one piece of a first output value to each of the NMOS transistors and outputs one piece of a second output value to each of the PMOS transistors, and
wherein the pre-boost circuit comprises:
a first logical product circuit that calculates a logical product of the inverted signal of the gate control signal and the output value of the first voltage monitoring circuit;
a plurality of first logical addition circuits, each provided for each of the NMOS transistors, each calculating a logical addition of a first output value of the corresponding gate mode setting circuit and an output value of the first logical product circuit, and each supplying the output value to the corresponding NMOS transistor;
a first logical addition circuit that calculates a logical addition of the inverted signal of the gate control signal and an inverted value of the output value of the second voltage monitoring circuit; and a plurality of second logical product circuits, each provided for each of the PMOS transistors, each calculating a logical product of the second output value of the corresponding gate mode setting circuit and the output value of the first logical addition circuit, and each supplying the output value to the corresponding PMOS transistor.

9. The semiconductor device according to claim 8, wherein the pre-boost circuit further comprises:
a second logical addition circuit that calculates a logical addition of the inverted signal of the gate voltage determination signal and the inverted signal of the gate control signal; and
a third logical addition circuit that calculates a logical addition of the inverted signal of the gate voltage determination signal and the output value of the first voltage monitoring circuit,
wherein the gate mode setting circuit comprises:
a first logic circuit group, each provided for each of the NMOS transistors; and
a second logic circuit group, each provided for each of the PMOS transistors,
wherein each of the first logic circuit group comprises:
a fourth logical addition circuit that calculates a logical addition of the output value of the first voltage monitoring circuit and the activation instruction signal;

a third logical product circuit that calculates a logical product of an output value of the fourth logical addition circuit and the inverted signal of the gate control signal;
an inverted logical addition circuit that calculates an inverted logical addition of an output value of the second logical addition circuit and the output value of the first voltage monitoring circuit; and
a fifth logical addition circuit that calculates a logical addition of an output value of the third logical product circuit and the output value of the inverted logical addition circuit, and that outputs the calculated logical addition as the first output value, and
wherein each of the second logic circuit group comprises:
an inverted logical addition circuit that calculates an inverted logical addition of the output value of the third logical addition circuit and the activation instruction signal; and
a sixth logical addition circuit that calculates a logical addition of the output value of the inverted logical addition circuit and the inverted signal of the gate control signal, and that outputs the calculated logical addition as the second output value.

10. The semiconductor device according to claim 1, wherein the power element is an IGBT device, and
wherein the first terminal is an emitter terminal, the second terminal is a collector terminal, and the control terminal is a gate terminal.

* * * * *